(12) United States Patent
Suzuki et al.

(10) Patent No.: US 6,379,859 B2
(45) Date of Patent: *Apr. 30, 2002

(54) POSITIVE PHOTORESIST COMPOSITION AND PROCESS FOR FORMING RESIST PATTERN USING SAME

(75) Inventors: Takako Suzuki; Sachiko Tamura; Kousuke Doi; Hidekatsu Kohara; Toshimasa Nakayama, all of Kanagawa (JP)

(73) Assignee: Tokyo Ohka Kogyo Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/322,978

(22) Filed: Jun. 1, 1999

(30) Foreign Application Priority Data

Jun. 4, 1998 (JP) ............................................. 10-156213

(51) Int. Cl.$^7$ ............................. G03F 7/023; G03F 7/30
(52) U.S. Cl. ....................... 430/191; 430/192; 430/193; 430/326; 430/330
(58) Field of Search ................................ 430/191, 192, 430/193, 165, 326, 330

(56) References Cited

U.S. PATENT DOCUMENTS

| | | | | | |
|---|---|---|---|---|---|
| 5,407,779 | A | * | 4/1995 | Uetani et al. | 430/192 |
| 5,609,982 | A | * | 3/1997 | Sato et al. | 430/192 |
| 5,629,127 | A | * | 5/1997 | Oosedo et al. | 430/191 |
| 5,639,587 | A | * | 6/1997 | Sato et al. | 430/190 |
| 5,652,081 | A | * | 7/1997 | Tan et al. | 430/192 |
| 5,700,620 | A | * | 12/1997 | Sakaguchi et al. | 430/191 |
| 5,726,217 | A | | 3/1998 | Ichikawa et al. | 522/59 |
| 5,747,218 | A | * | 5/1998 | Momota et al. | 430/192 |
| 5,853,948 | A | * | 12/1998 | Sawano et al. | 430/166 |
| 5,912,102 | A | * | 6/1999 | Uetani et al. | 430/191 |
| 6,120,969 | A | | 9/2000 | Hagihara et al. | 430/191 |

* cited by examiner

Primary Examiner—John S. Chu
(74) Attorney, Agent, or Firm—Sughrue Mion, PLLC

(57) ABSTRACT

Disclosed are a positive photoresist composition including (A) an alkali-soluble resin, (B) a photosensitizer containing a quinonediazide ester of, e.g., bis[2,5-dimethyl-3-(2-hydroxy-5-methylbenzyl)-4-hydroxyphenyl]methane and (C) e.g., 2,6-bis(2,5-dimethyl-4-hydroxybenzyl)-4-methylphenol; and a process including the steps of coating the composition onto a 8 to 12-inch substrate, drying, exposing and developing the same. The composition which can form a pattern having a good shape whose dimensional changes are minimized in a wide range over surface of the substrate, particularly in processes using a large-diameter substrate, and the process for forming a resist pattern using the composition are provided.

17 Claims, 5 Drawing Sheets

POSITIVE PHOTORESIST COMPOSITION AND PROCESS FOR FORMING RESIST PATTERN USING SAME

BACKGROUND OF THE INVENTION

1. Field of the Invention

The present invention relates to a positive photoresist composition having satisfactory sensitivity and definition. In particular, it relates to a positive photoresist composition which can give, in a process for forming a resist pattern using a large-diameter substrate, satisfactory pattern shapes in which dimensional changes over a wide range of the surface of the substrate are minimized, and to process for forming resist pattern using the composition.

2. Description of the Related Art

Positive photoresist compositions comprising an alkali-soluble resin and a quinonediazide ester have been satisfactorily applied in practice for the production of semiconductor devices and liquid-crystal display devices, since they have excellent definition, sensitivity and etching resistance.

In the current manufacture of ultralarge-scale integrated circuit (Ultra LSI), a high definition of not more than half a micron, for example, of 0.4 µm or 0.3 µm is required. There are, therefore, demands on photoresist compositions which can form a resist pattern satisfactory in definition, exposure margin, focal depth range properties and having a good shape.

In development, a puddle development technique is generally applied, in which a developer is applied all over the surface of a substrate from a developer-supplying nozzle disposed above the vicinity of the substrate's center, allowing the substrate to stand for several seconds and rotating it to remove the developer on the substrate's surface through centrifugal force generated by the rotation of substrate. The developer, therefore, is in contact with the substrate for somewhat longer in its center than in its periphery.

The use of a large-diameter, 8-to 12-inch substrate has been considered instead of a conventional 6-inch substrate, in order to enhance the throughput and productivity of semiconductor chips. In such a large-diameter substrate, however, the puddle developing technique invites tapering of a pattern and reduction in thickness of a resultant film in the center of substrate, which results in deteriorated yield of production.

In particular, when a resist pattern of not more than half a micron is formed, twist of pattern formation occurs in the substrate's center and the yield is reduced, and hence the enhancement of the throughput can hardly be achieved.

On the other hand, a variety of high-definition positive photoresist compositions have been reported which are directed to quinonediazide esters as photosensitizers (e.g., Japanese Patent Laid-Open Nos. 8-245461, 6-167805, 7-152152, 7-159990, 7-168355, 7-175213, 7-219220, 7-261382, 7-129255, 8-146602, 8-254824, 8-339079, 9-15854, 9-96904, 9-110755, 9-110757, 9-110760, 9-110762, 9-127690, 9-179293, 9-258437, 9-281702, 9-286751, 9-286752, 9-286753, 9-291054, 9-291055 and 9-291056).

These compositions exhibit high definition but are still insufficient to reduce dimensional changes in resist patterns on the surface of a substrate, and are still insufficient for the application to a large-diameter substrate in order to enhance the throughput.

Demands have, therefore, been made to provide positive photoresist compositions which can form a resist pattern of not more than half a micron having a good shape whose in-plane dimensional changes are minimized over a substrate's surface.

SUMMARY OF THE INVENTION

Accordingly, it is an object of the present invention to provide a positive photoresist composition which can form a resist pattern of not more than half a micron having a good shape in which dimensional changes over a wide range of the surface of a substrate are minimized, and to provide, particularly in a resist pattern forming process using a large-diameter substrate, a process for forming a resist pattern using the composition.

After the intensive investigations, the present inventors have solved the above problems of conventional techniques.

To be more specific, the present invention provides a positive photoresist composition comprising (A) an alkali-soluble resin, (B) a photosensitizer containing a quinonediazide ester of a compound of the following formula (I):

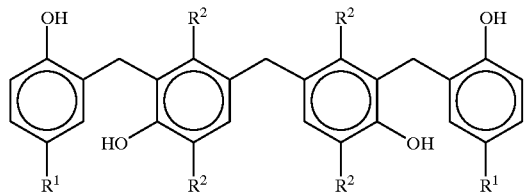

wherein each of $R^1$ and $R^2$ is independently a methyl group or an ethyl group, and (C) at least one of phenol group-containing compounds giving an elution time ranging from 6 to 30 minutes in high performance liquid chromatography determined under the following conditions: eluent: a mixed solvent of water/tetrahydrofuran/methanol=40/24/36 (by weight); column: 4.6 mm (diameter)×150 mm (length) containing 5 µm silica gel as a filler (carbon content being about 15%); column temperature: 45.0° C.; supply rate of eluent: 0.700 ml/min.

The compound represented by the formula (I) in the composition may be a compound of the following formula:

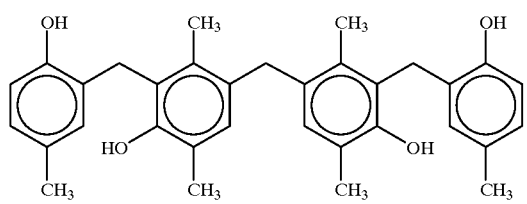

(Ia)

In addition, the compound represented by the formula (I) in the composition may be a compound of the following formula (Ib):

(Ib)

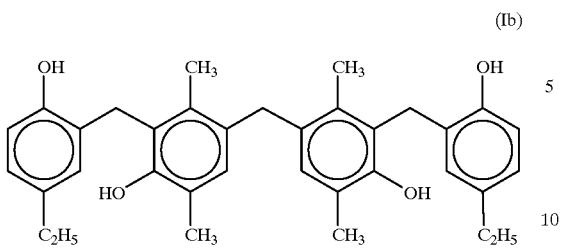

In the above composition, the content of Ingredient (C) may preferably range from 5% to 50% by weight relative to Ingredient (A).

The phenol-group containing compound, Ingredient (C), of the aforementioned composition may be at least one compound selected from:

(c1)

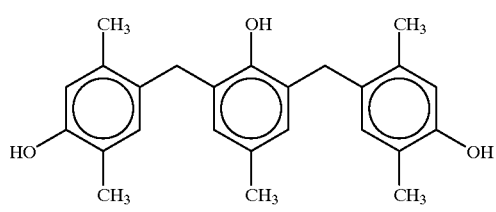

(c2)

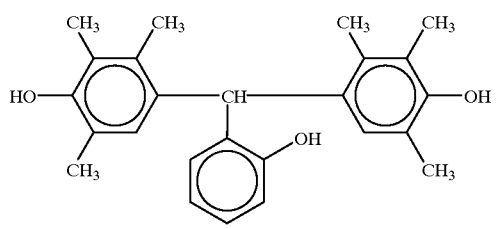

(c3)

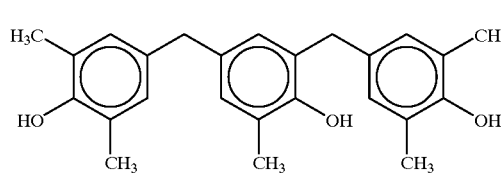

(c4)

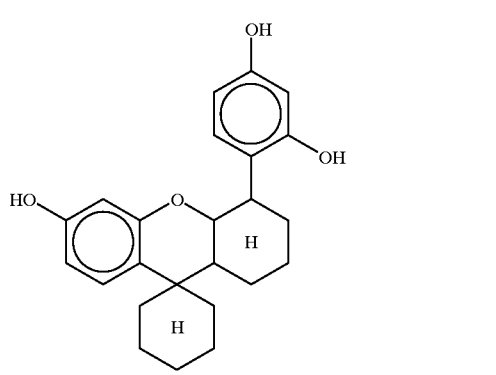

(c5)

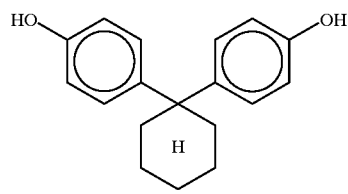

and (c6)

The invention provides, in another aspect, a process for forming a resist pattern comprising the steps of:

(1) coating the aforementioned positive photoresist composition onto a substrate having a diameter of 8 to 12 inches, and drying the coated substrate to form a resist film, (2) subjecting the resist film to selective exposure through a mask, (3) heating the exposed resist film, and (4) removing the resist film at exposed positions by an aqueous alkali solution.

BRIEF DESCRIPTION OF THE DRAWINGS

These and other features, objects, and advantages of the present invention will become apparent upon a consideration of the following description of the invention when read in conjunction with the drawings, in which.

Figure 1:
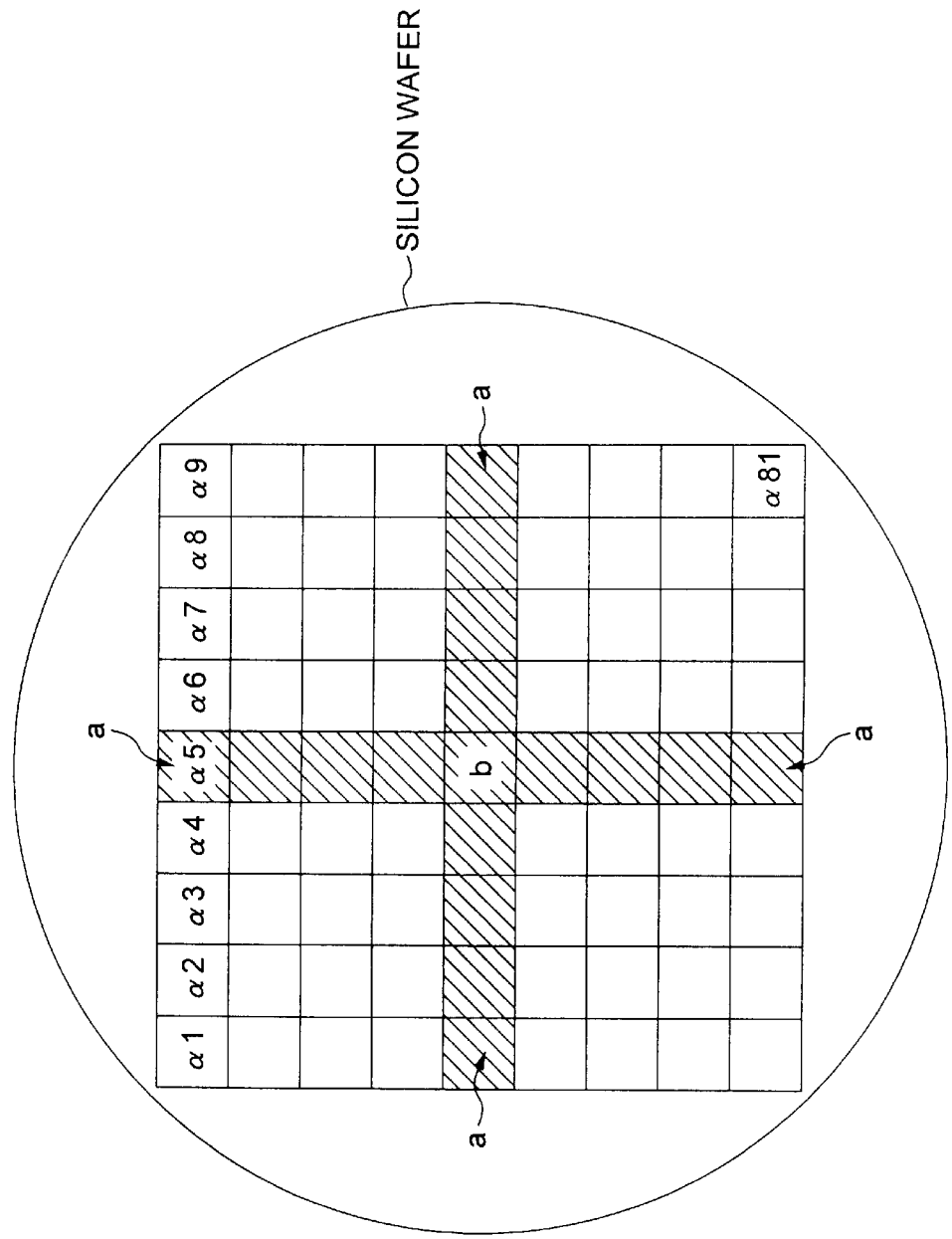
FIG. 1 illustrates a developing process and locations for the evaluation of sensitivity on resist patterns in the examples of the invention.

DETAILED DESCRIPTION OF THE INVENTION (A) Alkali-soluble Resin

An alkali-soluble resin used as Ingredient (A) is not limited and can be liberally chosen from those generally used as film-forming substances in positive photoresist compositions.

Examples of the alkali-soluble resins include condensates of aromatic hydroxyl compounds and aldehydes or ketones, polyhydroxystyrenes and their derivatives.

The aromatic hydroxyl compounds include, for example, phenol, m-cresol, p-cresol, o-cresol, 2,3-xylenol, 2,5-xylenol, 3,5-xylenol, 3,4-xylenol and other xylenols;

m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, p-ethoxyphenol, m-ethoxyphenol, p-propoxyphenol, m-propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols; phenylphenol and other aryl-substituted phenols; 4,4'-dihydroxybiphenyl, bisphenol A, resorcinol, hydroquinone, pyrogallol and other polyhydroxyphenols. These aromatic hydroxyl compounds can be used singly or in combination.

As suitable examples of the aldehydes, there may be mentioned formaldehyde, paraformaldehyde, trioxane, acetaldehyde, propionaldehyde, butylaldehyde, trimethylacetaldehyde, acrolein (acrylaldehyde), crotonaldehyde, cyclohexanaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes may be used independently or in combination.

Practical examples of the ketones include acetone, methyl ethyl ketone, diethyl ketone and diphenyl ketone. Each of these ketones may be used singly or in combination. Further, an optional combination of any of aldehydes and any of ketones can be employed.

The condensate of an aromatic hydroxyl compound and an aldehyde or a ketone can be prepared in the presence of an acidic catalyst according to a known technique. Such an acidic catalyst includes, for instance, hydrochloric acid, sulfuric acid, formic acid, oxalic acid and p-toluenesulfonic acid.

As the polyhydroxystyrenes and their derivatives, there may be mentioned, for example, vinylphenol homopolymers, copolymers of vinylphenol and a copolymerizable comonomer. Such a comonomer includes acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene and other styrene derivatives.

Of these alkali-soluble resins used in the present invention as Ingredient (A), novolak resins obtained from a phenol compound such as m-cresol, p-cresol, 2,5-xylenol, 3,5-xylenol, 2,3,5-trimethylphenol, and an aldehyde such as formaldehyde are advantageously used since they are effective in achieving high thermostability. Incidentally, low molecular weight fractions of the novolak resin have been removed. In particular, preferred are novolak resins containing 5% to 40% by mole of p-cresol, and, in addition, m-cresol and 2,5-xylenol as constitutive units and having an ortho-ortho bonding content of 20% to 80%.

The weight average molecular weight of the novolak resin should range from 2,000 to 25,000, preferably from 2,500 to 20,000 and more preferably from 5,000 to 10,000, while the resin should comprise no low molecular weight fraction. The term "weight average molecular weight" as used herein is defined as the value in terms of polystyrene measured by gel permeation chromatography (GPC).

The removal of low molecular weight fractions can be conducted by fractionation or other treatments. The fractionation is carried out by, for example, a process of dissolving a resin obtained by condensation in a good solvent and adding the resultant solution into water to thereby form precipitates. The good solvent includes, for instance, methanol, ethanol and other alcohols, acetone, methyl ethyl ketone and other ketones, ethylene glycol monoethyl ether acetate, and tetrahydrofuran.

(B) Photosensitizer

The photosensitizer (B) used in the composition of the invention is a photosensitizer containing a quinonediazide ester, and preferably containing a quinonediazide ester of the compound represented by the formula (I).

In particular, quinonediazide esters of the compounds represented by the formulae (Ia) and (Ib) are practically preferred among those of the compounds of the formula (I).

The average esterification ratio of the compound represented by the formula (I) is preferably 50%, in other words, the ester may preferably be diester-rich. The term "diester-rich" used herein means the peak area ratio of a diester determined at 254 nm by high performance liquid chromatography is relatively larger than any peak area ratios of other mono-, tri- and tetra-esters. Mono-, tri-, tetra-esters may be formed to some extent by the esterification, and these esters can be present in Ingredient (B).

The content of the quinonediazide ester of the compound represented by the formula (I) in Ingredient (B) may preferably be equal to or more than 50% by weight and more preferably equal to or more than 70% by weight. When the content is less than 50% by weight, definition is deteriorated and dimensional changes in resist pattern over the substrate's surface cannot sufficiently be minimized.

Any other quinonediazide esters than the above esters can be used concurrently, but the amount of such other ester may preferably be less than 50% by weight in Ingredient (B).

The other quinonediazide esters are esters between hydroxyl compounds other than above and quinonediazide compounds. The hydroxyl compound's include bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane and other terminal xylenol linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other linear pentanuclear compounds and other linear polyphenolic compounds; bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[2,5-dimethyl-3-(2-hydroxybenzyl)-4-hydroxyphenyl]methane and other linear tetranuclear compounds; 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and other polyhydroxybenzophenones; bis(4-hydroxy-2,3,5- trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane and other hydroxyaryls; phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially esterified or partially etherified gallic acid and other phenols.

The photosensitizer (B) in the composition of the present invention comprises an ester between any of the hydroxyl compounds as mentioned above and a quinonediazide compound. The quinonediazide compound includes, for example, naphthoquinone-1,2-diazidesulfonyl halides, o-benzoquinonediazidesulfonyl halides, o-anthraquinonediazidesulfonyl halides. Of these compounds, naphthoquinone-1,2-diazide-5-sulfonyl chloride, naphthoquinone-1,2-diazide-4-sulfonyl chloride, naphthoquinone-1,2-diazide-6-sulfonyl chloride and other naphthoquinone-1,2-diazidesulfonyl halides are preferred. The esterification can be conducted according to a conventional technique.

The amount of Ingredient (B) in the composition of the present invention may preferably fall in the range from 10% to 60% by weight and more preferably from 20% to 50% by weight relative to the total amount of Ingredient (A), alkali-soluble resin, and Ingredient (C). When the amount of Ingredient (B) is less than the above range, images in exact accordance with a pattern cannot be obtained and transfer property is deteriorated. When it exceeds the above range, the sensitivity and uniformity of a formed resist film are decreased, and the definition is deteriorated.

(C) Phenol Group-containing Compound

The term "phenol group-containing compound (C)" used in the composition of the present invention means any of phenol group-containing compounds which elute from a column within the specific elution time range when high performance liquid chromatography is conducted under the specific eluent, column, column temperature and supply rate of the eluent. The conditions of high performance liquid chromatography are described below:

Eluent: a solvent mixture of water:tetrahydrofuran:methanol=40:24:36 (by weight)

Figure 4:
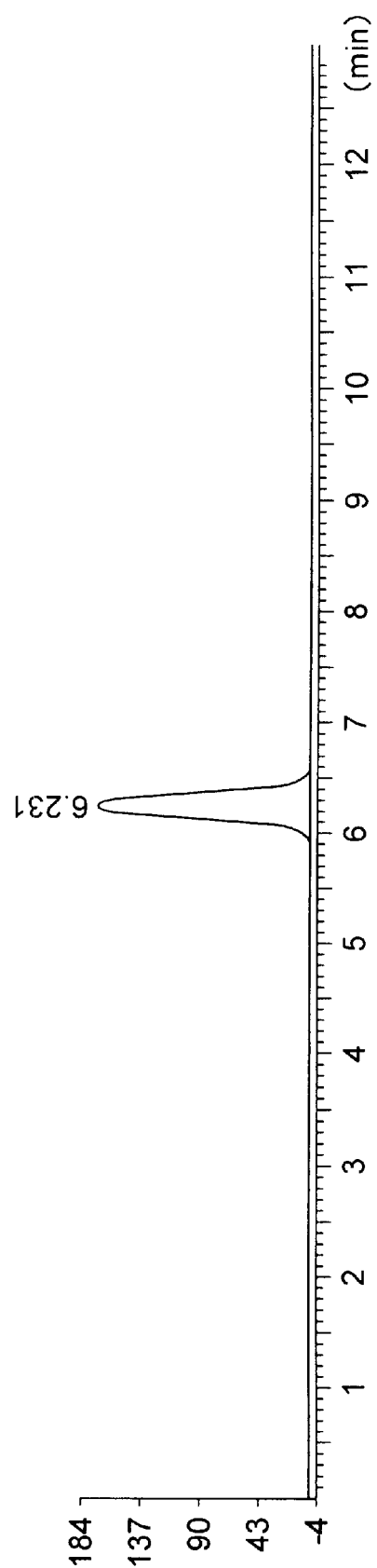
FIG. 4 is a chromatogram of an elution pattern of benzene.
Figure 5:
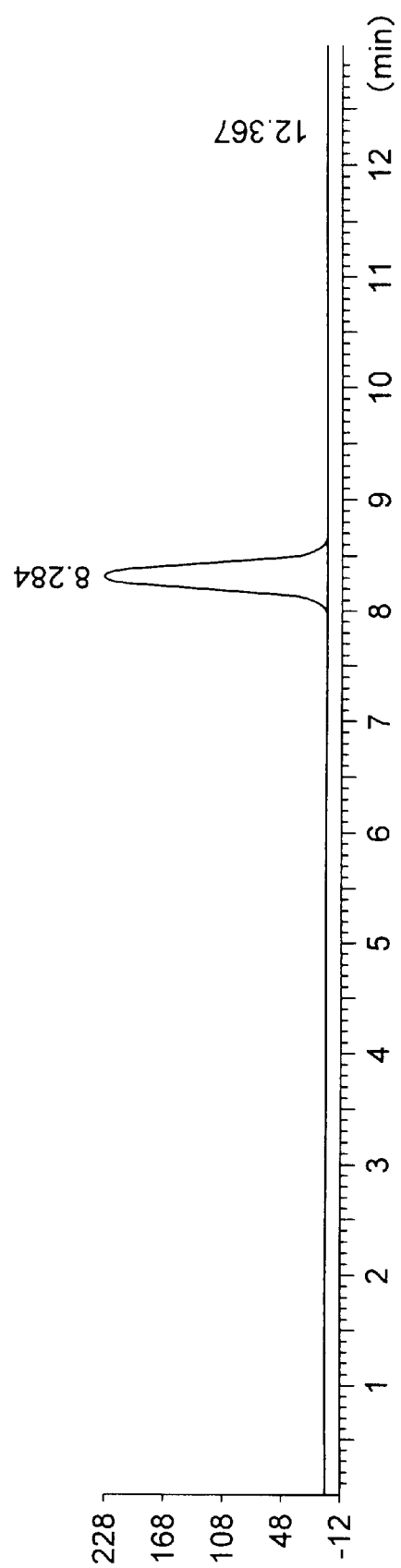
FIG. 5 is a chromatogram of an elution pattern of toluene.

Column: silica gel having a particle size of 5 $\mu$m is used as a filler (carbon content: about 15%), and the column size is 4.6 mm in diameter and 150 mm in length. The filler is preferably silica gel obtained by chemically bonding octadecyl groups to silicon in silica gel. As the column, Intersil ODS-2 (trade name, manufactured by GL Sience) can for example be used. In columns which can be used in the present invention, benzene and toluene respectively elute at about 6.231 minutes and at about 8.284 minutes, and the performances of columns to be used can be verified using these compounds. FIGS. 4 and 5 respectively illustrate chromatograms indicating elution patters of benzene and toluene.

Column temperature: 45.0° C. The column temperature can be adjusted through a thermoregulated bath or an oven.

Supply rate of eluent: 0.700 ml/min.

The elution time may fall in the range from 6 to 30 minutes, preferably from 7 to 15 minutes and particularly preferably from 8 to 12 minutes. When the elution time is less than 6 minutes, tapering of pattern and reduction in thickness in the substrate's center seriously occur and when it exceeds 30 minutes, the sensitivity is remarkably deteriorated.

The use of Ingredient (C) can advantageously suppress dimensional changes in resist pattern over a substrate. This advantage is significant particularly in puddle developing technique using a large-diameter substrate of about 8 to 12 inches.

As examples of the phenol group-containing compounds, Ingredient (C) which meet the above conditions, there may be mentioned compounds represented by the formulae (c1) through (c6). The elution times of the compounds of formulae (c1), (c2), (c3), (c4), (c5) and (c6) are, respectively, 10.159 min., 6.57 min., 10.700 min., 9.952 min., 7.445 min., and 8.94 min.

The composition of the invention, where Ingredient (B) and Ingredient (C) are used in combination, can provide suppressing effects for minimizing dimensional changes in resist pattern over a substrate, in particular suppressing effect of pattern tapering and reduction in thickness in the center of a substrate, even when a large-diameter substrate is employed.

The amount of Ingredient (C) can be selected within the range from 5% to 50% by weight and preferably from 10% to 35% by weight relative to the alkali-soluble resin, Ingredient (A).

The composition of the present invention can further comprise any of polyphenol compounds known as sensitizers (sense amplifiers).

By way of example, the compounds represented by the formula (I) or other compounds can be employed. Typical examples of the polyphenol compounds include bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, 2,6-bis(3,5-dimethyl-4-hydroxybenzyl)-4-methylphenol, bis(3,5-dimethyl-4-hydroxyphenyl)-2-hydroxyphenylmethane, 2,4-bis(3,5-dimethyl-4-hydroxybenzyl)-5-hydroxyphenol, and bis(3,5-dimethyl-4-hydroxyphenyl)-3,4-dihydroxyphenylmethane.

The content of the sensitizer, if added, may fall in the range from 5% to 50% by weight, and preferably from 10% to 35% by weight relative to the alkali-soluble resin, Ingredient (A).

Where necessary, the composition may further comprise any of compatible additives including, for example, ultraviolet absorbents for inhibition of halation and surfactants for prevention of striation within a range not adversely affecting the objects of the present invention. Examples of the ultraviolet absorbents include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. As the surfactants, there maybe mentioned, for instance, Fluorade FC-430 and FC-431 (trade names, manufactured by Sumitomo 3M Ltd., Japan), F-TOP EF122A, EF122B, EF122C and EF126 (trade names, manufactured by Tochem Products Ltd., Japan) and other fluorine-containing surfactants.

The composition of the present invention may preferably be used as a solution obtained by dissolving Ingredients (A), (B) and (C), and each of ingredients added according to necessity, in a proper solvent.

Practical examples of the solvent include solvents conventionally used for positive photoresist compositions, such as acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and their derivatives; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these solvents may be used solely or in combination. In particular, acetone, methyl ethyl ketone, cyclohexanone, methyl isoamyl ketone, 2-heptanone and other ketones; ethyl lactate, methyl acetate, ethyl acetate, butyl acetate, methyl pyruvate, ethyl pyruvate, methyl methoxypropionate, ethyl ethoxypropionate and other esters are desirable.

Practically, the composition may be used, for example, in the following manner: Each of Ingredients (A), (B) and (C), and other ingredients added according to necessity is dissolved in a proper solvent as mentioned above to give a coating solution; the coating solution is then applied, using a spinner or the like, onto a substrate such as a silicon wafer or a substrate on which an adhesion promoter coat or an antireflection coating has been formed, and subsequently dried to form a photosensitive layer; next, the photosensitive layer is irradiated and exposed with an ultraviolet ray source such as a low-pressure mercury lamp, a high-pressure mercury lamp, an ultra-high-pressure mercury lamp, or a xenon lamp, through a desired mask pattern, or irradiated with a scanning electron beam; and the exposed portions of the film are then dissolved and removed by dropping a developer solution, for example, an alkaline aqueous solution such as a 1% to 10% by weight tetramethylammonium hydroxide (TMAH) aqueous solution from a developer dropping nozzle disposed above the vicinity of the center of substrate, thus covering all over the surface of the substrate with the developer; allowing the substrate to stand for 50 to 60 sec. and then rotating the substrate by a spinner to remove the developer, thus forming an image being in exact accordance with the mask pattern.

EXAMPLES

The present invention will be further illustrated in detail with reference to several inventive examples and comparative examples below.

Each of the characteristics of the positive photoresist compositions was evaluated according to the following manner, respectively.

(1) Sensitivity

A sample was applied onto a 8-inch silicon wafer using a spinner, and dried on a hot plate at 90° C. for 90 sec. to form a resist film having a thickness of 1.05 $\mu$m. The resist film was then irradiated for an increasing period from 0.1 sec. at intervals of 0.01 sec. using a reducing-type projection aligner NSR-2005i10D (manufactured by Nikon Corporation, Japan; NA=0.57). The film was then post-exposure baked (PEB) at 110° C. for 90 sec.; subjected to puddle developing in a 2.38% by weight tetramethylammonium hydroxide (TMAH) aqueous solution at 23° C., washed with water for 30 sec., and dried. In this procedure, the sensitivity was defined as the exposure time period (ms) to give exposed portion having a thickness of zero after development.

The developing process will be described in detail with reference to FIG. 1. FIG. 1 illustrates the developing process and locations where the sensitivity was evaluated on resist patterns in the examples of the invention. The silicon wafer was provided with a total of 81 resist patterns in 81 blocks including $\alpha 1$, $\alpha 2$, $\alpha 3$ ... $\alpha 81$ (one block was 20 mm×20 mm). The block in the substrate's center was designated as "block b" and four blocks in the periphery at 80 mm distance from the center were designated as "blocks a". The developing was carried out in the following manner using a tubular nozzle developing device (product name: TR6132UD, Tatsumo K.K., Japan) and the evaluation of sensitivity was carried out on the block a in FIG. 1.

[Developing Process]

Onto a substrate after post exposure baked (PEB), the developer was dropped from above the block b in FIG. 1 under a discharge pressure of 0.7 kg/cm³, at discharge rate of 0.6 L/min over 7 sec., the substrate was then allowed to stand for 53 sec. (the developing time period was a total of 60 sec.=7 sec.+53 sec.), and washed with pure water at 3000 rpm for 30 sec. to remove the developer above the surface of substrate.

(2) Definition

The definition was defined as the critical definition at an exposure which reproduced a 0.35 $\mu$m mask pattern.

The evaluation of the definition was conducted on resist patterns on the periphery of substrate (blocks a in FIG. 1).

(3) Focal Depth Range Properties

A sample was subjected to exposure and development using a reducing-type projection aligner NSR-2005i10D (manufactured by Nikon Corporation, Japan; NA=0.57) at an exposure of Eop (the exposure time period to reproduce the set dimensions of mask pattern (line width 0.35 $\mu$m, line-and-space (L&S) 1:1) as a standard exposure, where the focus was shifted up and down at this exposure. The obtained resist pattern was subjected to an SEM photographic observation. Based upon the SEM photograph, the focal depth range was defined as the maximum value ($\mu$m) of the focal shift (defocus) to obtain a 0.35 $\mu$m rectangular resist pattern within a variation of ±10% of the set dimensions.

The focal depth range properties were evaluated on resist patterns on the periphery of substrate (blocks a in FIG. 1).

(4) Evaluation of Dimensional Changes

When a 0.35 $\mu$m resist pattern was obtained on the periphery of substrate (block a in FIG. 1), the size of a resist pattern formed in the substrate's center (block b in FIG. 1) was defined as x $\mu$m, and the dimensional change rate (decreasing rate) was calculated according to the following equation:

$$\text{Dimensional change rate (decreasing rate)} = [(0.35-x)/0.35] \times 100(\%)$$

(5) Evaluation of Yield

A total of 81 resist patterns of the identical shape were formed on a 8-inch silicon wafer in the manner as in Evaluation (1), the sensitivity (FIG. 1).

On each of the 81 resist patterns, the dimensional changes were evaluated in the manner as in Evaluation (4), and the total number of resist patterns whose change rates were less than 10% was defined as y, and the yield was calculated according to the following equation:

$$\text{Yield} = (y/81) \times 100(\%)$$

Example 1

Ingredient (A)

Alkali-soluble novolak resin: 100 parts by weight [a resin composed of m-cresol:p-cresol:2,5-xylenol=5:1:4 (by mole) whose low molecular weight fractions were removed (Mw=6800, ortho-ortho bonding content 45%)]

Ingredient (B)

b1:b2=7:1 (by weight): 57 parts by weight [b1: diester of bis[2,5-dimethyl-3-(2-hydroxy-5-methylbenzyl)-4-hydroxyphenyl]methane (compound represented by the formula (Ia)), b2: triester of methyl gallate]

Ingredient (C)

c1: 33 parts by weight [c1: 2,6-bis(2,5-dimethyl-4-hydroxybenzyl)-4-methylphenol (compound represented by the formula (c1), elution time: 10.159 min.)]

A positive photoresist composition was obtained by dissolving the above Ingredients (A), (B) and (C) in 470 parts by weight of 2-heptanone, and filtering the solution with a membrane filter having a pore size of 0.2 μm.

The determination using high performance liquid chromatography was conducted in the following manner:

(i) A sample was dissolved in tetrahydrofuran to give a 0.5% by weight sample solution.

(ii) An eluent of water:tetrahydrofuran:methanol= 40:24:36 (by weight) was passed through a column at a supply rate of 0.700 ml/min for 10 minutes. The column was composed of 5 μm silica gel as a filler (carbon content being about 15%) and had a column size of 4.6 mm in diameter×150 mm in length (product name: Intersil ODS-2, GL Science). The column temperature was adjusted to 45.0° C. using an oven.

(iii) The sample solution (1.0 μl) was injected into the chromatography and the elution time of the sample detected in the vicinity of 280.4 nm was determined.

Table 1 demonstrates the elution times of the samples c1 through c6 and d1 through d4 respectively used in the inventive examples and comparative examples.

TABLE 1

| Sample | Elution Time (min) |
|---|---|
| c1 | 10.159 |
| c2 | 6.570 |
| c3 | 10.700 |
| c4 | 9.952 |
| c5 | 7.445 |
| c6 | 8.940 |
| d1 | 5.338 |
| d2 | 4.317 |

TABLE 1-continued

| Sample | Elution Time (min) |
|---|---|
| d3 | 5.254 |
| d4 | 5.569 |

Figure 2:
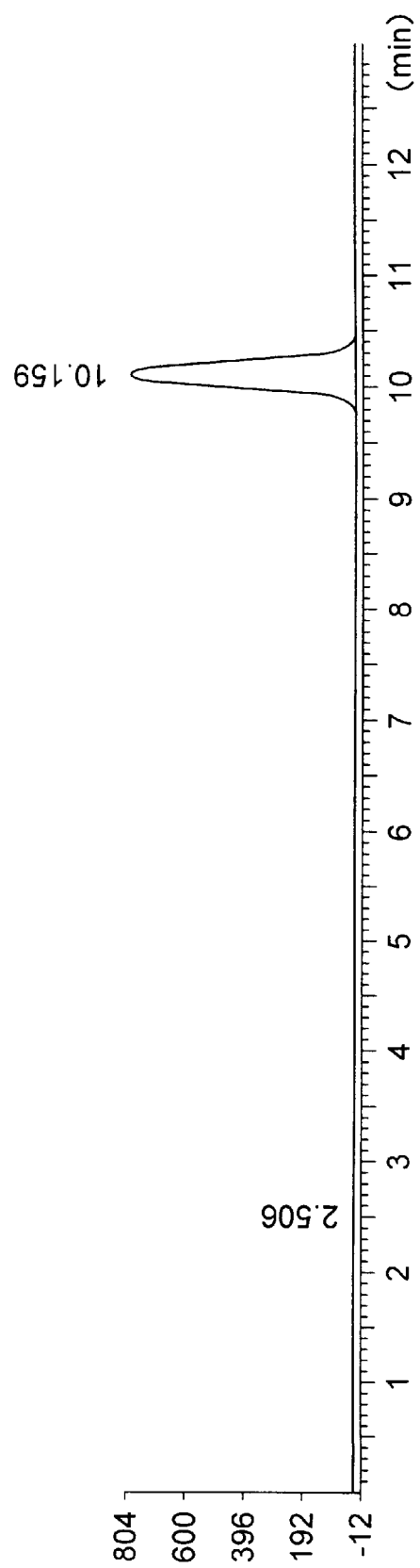
FIG. 2 is a chromatogram of the compound c1 used in the examples.
Figure 3:
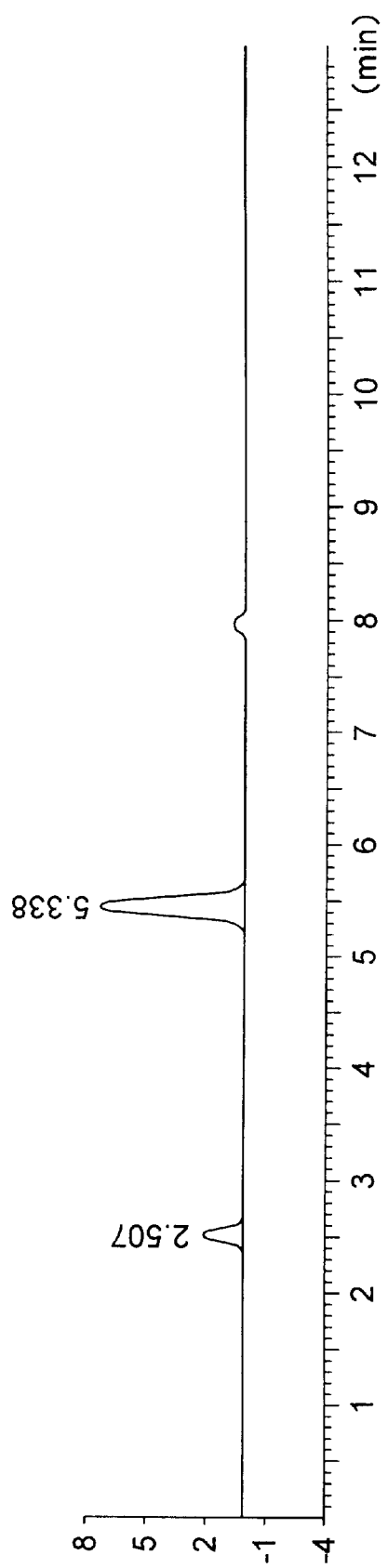
FIG. 3 is a chromatogram of the compound d1 used in the examples.

Chromatograms of c1 and d1 are illustrated in FIGS. 2 and 3, respectively.

Examples 2 to 10 and Comparative Examples 1 to 4

A series of samples were prepared and their characteristics were evaluated in a similar manner as in Example 1, except that each of Ingredient (B), Ingredient (C), the sensitizer and developing time (standing time) was changed as indicated in Table 2 below.

Table 3 demonstrates the above characteristics (1) through (5) on coating compositions prepared in Examples 1 through 10 and Comparative Examples 1 though 4.

TABLE 2

| Example | Ingredient (B) | Ingredient (C) (wt %) | Sensitizer (wt %) | Developing Time (sec.) |
|---|---|---|---|---|
| 1 | b1/b2 (7/1) | c1 (33) | — | 60 |
| 2 | " | c2 (33) | — | 60 |
| 3 | " | c3 (33) | — | 75 |
| 4 | " | c4 (33) | — | 75 |
| 5 | " | c5 (33) | — | 45 |
| 6 | " | c6 (33) | — | 45 |
| 7 | " | c1/c5 (1/1) (33) | — | 60 |
| 8 | " | c2/c6 (3/7) (33) | — | 45 |
| 9 | b3/b2 (7/1) | c1/c5 (1/1) (33) | — | 60 |
| 10 | b1/b2 (7/1) | c5 (15) | d1 (15) | 45 |
| Comp. ex. 1 | b4/b2 (7/1) | c1 (33) | — | 60 |
| Comp. ex. 2 | b1/b2 (7/1) | — | d2 (33) | 60 |
| Comp. ex. 3 | b1/b2 (7/1) | — | d3 (33) | 60 |
| Comp. ex. 4 | b1/b2 (7/1) | — | d4 (33) | 60 |

Note: Evaluations (1) through (3) were conducted at a developing time of 60 sec., and Evaluations (4) and (5) were conducted at the developing time indicated in the table.

b1: Diester-rich quinonediazide esters of the compound represented by the formula (Ia)
b2: Triester-rich quinonediazide esters of methyl gallate
b3: Diester-rich quinonediazide esters of the compound represented by the formula (Ib)
b4: Diester-rich quinonediazide esters of bis(3,5-dimethyl-4-hydroxyphenyl)-2-hydroxyphenylmethane
c1: Compound-represented by the formula (c1)
c2: Compound represented by the formula (c2)
c3: Compound represented by the formula (c3)
c4: Compound represented by the formula (c4)
c5: Compound represented by the formula (c5)

c6: Compound represented by the formula (c6)
d1: 2,6-Bis(3,5-dimethyl-4-hydroxybenzyl)-4-methylphenol
d2: Bis(3,5-dimethyl-4-hydroxyphenyl)-2-hydroxyphenylmethane
d3: 2,4-Bis(3,5-dimethyl-4-hydroxybenzyl)-5-hydroxyphenol
d4: Bis(3,5-dimethyl-4-hydroxyphenyl)-3,4-dihydroxyphenylmethane

TABLE 3

| Example | Sensitivity (ms) | Definition (µm) | Focal depth range properties | dimensional change rate (%) | Yield (%) |
|---|---|---|---|---|---|
| 1 | 460 | 0.30 | 1.2 | 10.86 | 88.89 |
| 2 | 460 | 0.30 | 1.2 | 10.57 | 90.12 |
| 3 | 440 | 0.28 | 1.0 | 15.14 | 62.96 |
| 4 | 400 | 0.28 | 1.0 | 15.71 | 60.49 |
| 5 | 550 | 0.26 | 1.2 | 15.14 | 61.73 |
| 6 | 490 | 0.28 | 1.0 | 16.00 | 60.49 |
| 7 | 490 | 0.28 | 1.4 | 14.29 | 69.14 |
| 8 | 450 | 0.30 | 1.2 | 14.00 | 65.43 |
| 9 | 520 | 0.26 | 1.2 | 13.71 | 74.07 |
| 10 | 520 | 0.28 | 1.2 | 16.57 | 59.25 |
| Comp. ex. 1 | 400 | 0.30 | 0.8 | 22.86 | 44.44 |
| Comp. ex. 2 | 460 | 0.30 | 1.0 | 21.43 | 50.62 |
| Comp. ex. 3 | 440 | 0.30 | 0.8 | 25.71 | 39.51 |
| Comp. ex. 4 | 400 | 0.28 | 1.2 | 31.43 | 34.57 |

According to the present invention, a positive photoresist composition can be obtained, which can form a resist pattern of not more than half a micron having a good shape on which dimensional changes are minimized over a wide range of a substrate, and give satisfactory focal depth range properties and yield.

The process for the information of resist patterns using the composition of the invention is advantageous particulary on processes using a large-diameter substrate.

While the invention has been described in detail and with reference to specific embodiments thereof, it will be apparent to one of ordinary skill in the art that various changes and modifications can be made therein without departing from the spirit and scope thereof.

What is claimed is:

1. A positive photoresist composition comprising
(A) an alkali soluble resin,
(B) a photosensitizer containing a quinonediazide ester of methyl gallate and a quinonediazide ester of a compound of the following formula (I):

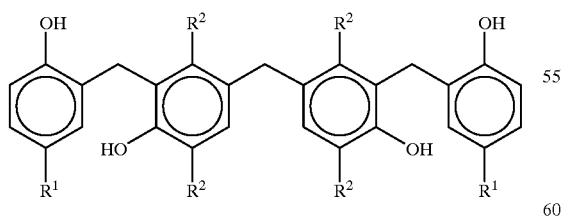

wherein each of $R^1$ and $R^2$ is independently a methyl group or an ethyl group, and
(C) at least one compound of phenol group-containing compounds selected from the group consisting of the following compounds (c1)–(c6) and having an elution time in the range from 6 to 30 minutes in high performance liquid chromatography, said high performance liquid chromatography being conducted under the following conditions:

eluent: a mixed solvent of water:tetrahydrofuran:methanol=40:24:36 (by weight);

column: 4.6 mm (diameter)×150 mm (length) containing 5 µm silica gel as a filler (carbon content being about 15%);

column temperature: 45.0° C.; and supply rate of eluent: 0.700 ml/min

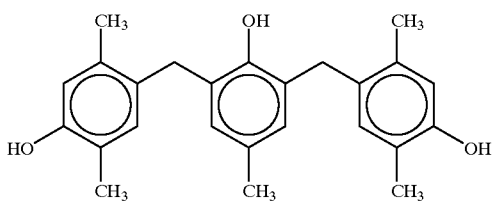

(c1)

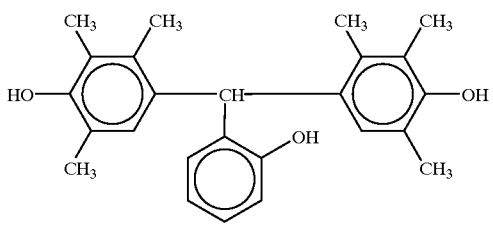

(c2)

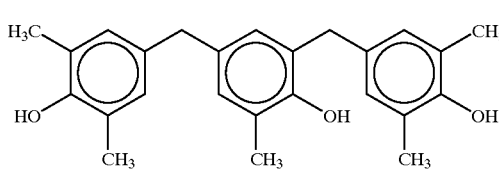

(c3)

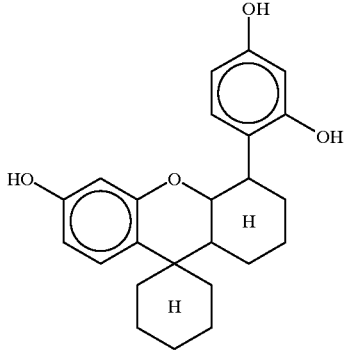

(c4)

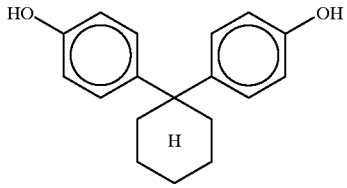

(c5)

-continued

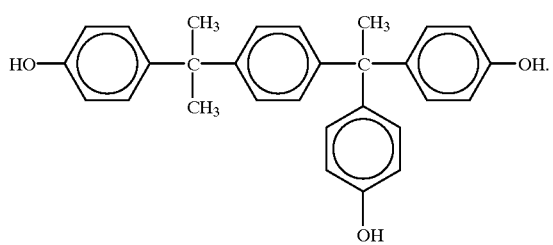

(c6)

2. The composition according to claim 1, wherein said compound represented by the formula (I) is a compound of the following formula (Ia):

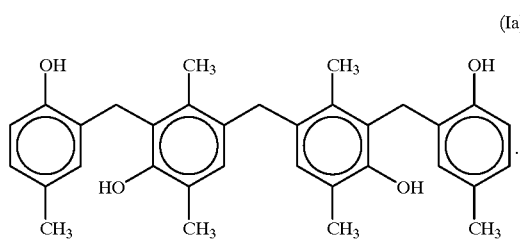

(Ia)

3. The composition according to claim 1, wherein said compound represented by the formula (I) is a compound of the following formula (Ib):

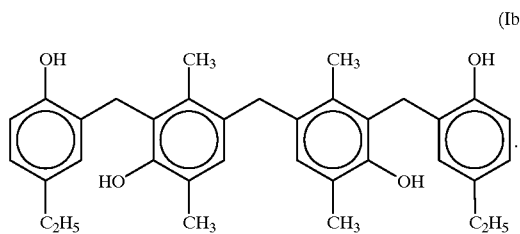

(Ib)

4. The composition according to claim 1, wherein the content of Ingredient (C) ranges from 5% to 50% by weight relative to Ingredient (A).

5. The positive photoresist composition as claimed in claim 1, wherein the elution time of the at least one compound of phenol group-containing compounds is within a range from 7 to 15 minutes in high performance liquid chromatography.

6. The positive photoresist composition as claimed in claim 5, wherein the elution time of the at least one compound of phenol group-containing compounds is within a range from 8 to 12 minutes in high performance liquid chromatography.

7. The positive photoresist composition as claimed in claim 1, further comprising an ultraviolet absorbent.

8. The positive photoresist composition as claimed in claim 7, wherein said ultraviolet absorbent is selected from the group consisting of 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin.

9. The positive photoresist composition as claimed in claim 1, further comprising a surfactant.

10. The positive photoresist composition as claimed in claim 9, wherein said surfactant is selected from the group consisting of FLUORADE FC-430, FLUORADE FC-431, F-TOP EF122A, F-TOP EF122B, F-TOP EF122C and F-TOP EF126.

11. The positive photoresist composition as claimed in claim 1, wherein said phenol group-containing compound has formula (c1).

12. The positive photoresist composition as claimed in claim 1, wherein said phenol group-containing compound has formula (c2).

13. The positive photoresist composition as claimed in claim 1, wherein said phenol group-containing compound has formula (c3).

14. The positive photoresist composition as claimed in claim 1, wherein said phenol group-containing compound has formula (c4).

15. The positive photoresist composition as claimed in claim 1, wherein said phenol group-containing compound has formula (c5).

16. The positive photoresist composition as claimed in claim 1, wherein said phenol group-containing compound has formula (c6).

17. A process for forming a resist pattern comprising the steps of:
(1) coating the positive photoresist composition of claim 1 onto a substrate having a diameter ranging from 8 to 12 inches, and drying the coated substrate to form a resist film,
(2) subjecting said resist film to selective exposure though a mask,
(3) heating said resist film, and
(4) removing the resist film at exposed positions by an aqueous alkali solution.

* * * * *